United States Patent [19]

Chen

[11] Patent Number: 4,710,477

[45] Date of Patent: Dec. 1, 1987

[54] METHOD FOR FORMING LATCH-UP IMMUNE, MULTIPLE RETROGRADE WELL HIGH DENSITY CMOS FET

[75] Inventor: John Y. Chen, Los Angeles, Calif.

[73] Assignee: Hughes Aircraft Company, Los Angeles, Calif.

[21] Appl. No.: 898,180

[22] Filed: Aug. 20, 1986

Related U.S. Application Data

[62] Division of Ser. No. 531,546, Sep. 12, 1983, Pat. No. 4,633,289.

[51] Int. Cl.$^4$ ........................................... H01L 21/265
[52] U.S. Cl. ........................................ 437/34; 437/40; 437/57; 437/248; 437/934
[58] Field of Search ................. 29/571, 576 B, 577 C; 148/DIG. 3, DIG. 4; 357/42, 52

[56] References Cited

U.S. PATENT DOCUMENTS

| | | | |
|---|---|---|---|
| 4,053,925 | 10/1977 | Burr et al. | 148/1.5 |
| 4,167,425 | 9/1979 | Herbst | 148/1.5 |
| 4,216,030 | 8/1980 | Graul et al. | 148/1.5 |
| 4,306,916 | 12/1981 | Wollesen et al. | 29/576 B |
| 4,315,781 | 2/1982 | Henderson | 29/576 B |
| 4,318,750 | 3/1982 | Rai-Choudhury | 148/1.5 |
| 4,369,072 | 1/1983 | Bakeman, Jr. et al. | 29/576 B |
| 4,411,058 | 10/1983 | Chen | 29/576 B |
| 4,439,245 | 3/1984 | Wu | 29/576 B |
| 4,534,806 | 8/1985 | Magdo | 29/576 B |
| 4,585,489 | 4/1986 | Hiraki et al. | 29/576 B |

OTHER PUBLICATIONS

Rung, "A Retrograde P-Well for Higher Density CMOS", IEEE Trans. on Elechon-Devices, vol. ED-28, OCT, 81, pp. 1115-1119.

Ochoa, "Latch-Up Control in CMOS Integrated Circuits", IEEE Trans. on Nuclear Science, vol. WS-26, No. 6, Dec. 79, pp. 5065-5068.

Adams, "Neutron Irradiations for Preventions of Latch-Up in MOS Integrated Circuits", IEEE Trans. on Nuclear Science, vol. WS26, Dec. 79, pp. 5069-5072.

Primary Examiner—Brian E. Hearn
Assistant Examiner—Tom Thomas
Attorney, Agent, or Firm—Terje Gudmestad; V. D. Duraiswamy; A. W. Karambelas

[57] ABSTRACT

A high density CMOS device structure that is essentially immune to latch-up, and a method of fabricating the structure, is described. This is obtained by providing a well region within and adjacent a surface of a substrate, the well region having a multiple retrograde doping density profile, and by providing source and drain regions within the well and adjacent the surface of the substrate, the source and drain regions having associated therewith a greater than average density of residual defects within said well region, the greater density of residual defects being generally associated with the deepest portions of the source and drain regions and the immediately underlying portions of said well region, respectively.

6 Claims, 2 Drawing Figures

METHOD FOR FORMING LATCH-UP IMMUNE, MULTIPLE RETROGRADE WELL HIGH DENSITY CMOS FET

This is a division of application Ser. No. 531,546 filed Sept. 12, 1983 now U.S. Pat. No. 4,633,289.

BACKGROUND OF THE INVENTION

1. Field of the Invention

The present invention generally relates to high density CMOS FET devices and integrated circuits, and the fabrication of such, and, in particular, to high density CMOS FETs having residual defects particularly associated with source and drain regions formed in a multiple retrograde doping profile well structure that essentially eliminates the occurrence of latch-up during operation.

2. Description of the Prior Art

Reduction of feature size (scaling) is necessary for the application of CMOS FET devices to VLSI integrated circuits. Scaled, and therefore high density, CMOS devices are plagued by a condition known as latch-up. Encountered during operation, latch-up is characterized as a high current condition wherein the device is irreversibly latched into a single electrical state typically preventing the entire circuit from functioning properly and resulting in device damage, if not complete destruction.

The latch-up condition is generally attributed to the presence and undesirable function of parasitic bipolar transistors inherently formed in the CMOS FET structure. The configuration of the parasitic bipolar transistors is such that a closed loop feedback path typically having a gain greater than one exists. Thus, when random, atypical operational conditions are encountered, such as electrical transients, regenerative feedback occurs with a resultant latch-up of the device's electrical state.

CMOS latch-up is a commonly recognized problem. See, for example, "The Physics and Modeling of Latch-up in CMOS Integrated Circuits," D. B. Estreich, Technical Report No. G-201-9, prepared under Defense Advanced Research Projects Agency Contract No. DAAG-07-C-2684, November 1980; summarized in "Modeling Latch-up in CMOS Integrated Circuits", D. B. Estreich and R. W. Dutton, IEEE Transactions on Computer Aided Design of Integrated Circuits and Systems, Vol. CAD-1, No. 4, October 1982, pp. 157–162; "A Retrograde P-Well for Higher Density CMOS", R. D. Rung et al., IEEE Transactions on Electron Devices, Vol. ED-28, No. 10, October 1981, pp. 1115–1119; "Method for Radiation Hardening Semiconductor Devices and Integrated Circuits to Latch-Up Effects", U.S. Pat. No. 4,318,750; and "Silicon-Gate C-MOS Chips Gain Immunity to SCR Latch-up", L. Walneman, Electronics, Vol 56, No. 16, Aug. 11, 1983, pp. 136–140.

Correspondingly, a large variety of methods of reducing the parasitic loop gain have been proposed. These include, most notably, the provision of parasitic-current blocking or shorting guard-ring structures interposed between the complementary PMOS and NMOS FET transistors of the CMOS device, utilizing a deep peak or retrograde doping profile well region, irradiation of the CMOS device with high energy particles such as neutrons and protons, and provision of low resistivity buried layers in the CMOS structure. However, these methods are variously disadvantageous due to substantially increased device structure and fabrication process complexity, low degrees of reproducibility, excessive degradation of device's operating characteristics including substantially increased leakage currents, and, in particular, failure to reduce the parasitic feedback loop gain to less than one.

SUMMARY OF THE INVENTION

The general purpose of the present invention is therefore to provide a CMOS device structure, and method of fabricating the structure, that is essentially immune to latch-up.

This is accomplished in the present invention by providing a well region within and adjacent a surface of a substrate, the well region being provided with a multiple retrograde doping density profile, and by providing source and drain regions within the well region also adjacent the surface of the substrate, the source and drain regions having particularly associated therewith a greater than average density of residual defects within the well region and generally associated with deepest portions of the source and drain regions and the immediately underlying portions of the well region, respectively.

Thus, an advantage of the present invention is that the parasitic feedback loop gain is reduced to approximately one or less by the localized inhibition of the operation of the parasitic bipolar transistors.

Another advantage of the present invention is that there is no significant adverse affect to the desirable operational characteristics of a CMOS device provided in accordance with the present invention.

A further advantage of the present invention is that it can be efficiently incorporated into any high density CMOS fabrication process.

Still another advantage of the present invention is that a CMOS device provided in accordance with the present invention may be directly scaled without any adjustment of the design as would be necessary to include additional structures requiring substrate surface area.

BRIEF DESCRIPTION OF THE DRAWING

Other advantages and further features of the present invention will become readily apparent as the same becomes better understood by reference to the Detailed Description of the Invention when considered in conjunction with the accompanying Drawing wherein.

DETAILED DESCRIPTION OF THE INVENTION

Figure 1:
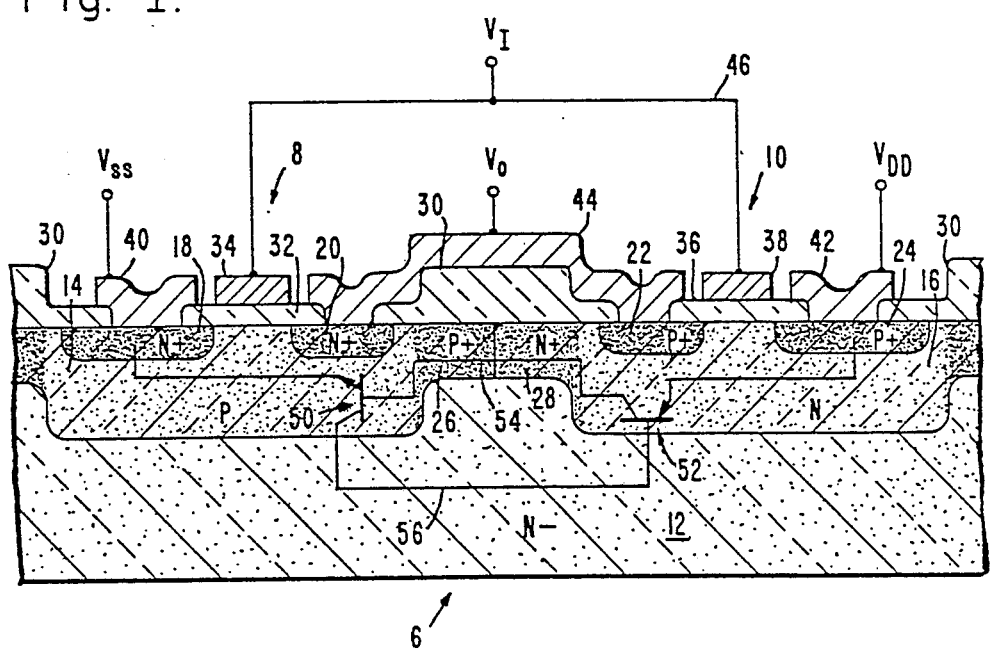
FIG. 1 is a cross section of a CMOS device structure to which the present invention is preferably applied, a circuit schematic of the parasitic bipolar transistor pair and their significant interconnection being shown as an overlay.

A cross section of a CMOS FET structure, generally indicated by the reference numeral 6, is shown in FIG. 1. This CMOS structure constitutes the preferred embodiment of the present invention. The manner of the fabrication of the CMOS structure 6 and its operation are described at length in U.S. Pat. No. 4,411,058 issued Oct. 25, 1983 to John Y. Chen which is assigned to the Assignee of the present invention. These applications are expressly incorporated herein by reference. However, for purposes of clarity, the significant features of the CMOS structure 6 and the particular steps necessary for its fabrication will be described below.

The CMOS FET structure 6 is comprised of a semiconductor substrate 12, preferably silicon lightly doped to an N⁻ type conductivity with phophorous at a concentration of approximately $5 \times 10^{-14}$ cm$^{-3}$. Active devices wells 14, 16 are provided in the substrate 12 adjacent a top substrate surface. The wells 14, 16 are more heavily doped than the substrate 12, preferably with boron and phosphorous respectively, so as to form complementary P- and N-type wells. Highly doped P$^+$ and N$^+$ channel stops 26, 28 separate the twin-wells 14, 16. An N channel active device, generally indicated by the reference numeral 8, comprising heavily doped N$^+$ source and drain regions 18, 20, gate oxide layer 32, gate 34, and source region contact 40, is formed at the surface of the P-well 14. A complementary P channel active device, generally indicated by the reference numeral 10, comprising heavily doped P$^+$ type drain and source regions 22, 24, gate oxide layer 36, gate 38 and source region contact 42, is provided at the surface of the N-well 16. The complementary electrical operation of the CMOS FET structure 6 is insured by the provision of an electrical interconnection 46 between the two gates 34, 38 to which an input signal, $V_I$, is applied and by the provision of a common drain contact 44 from which an output signal, $V_O$, is obtained.

The process by which the CMOS FET structure 6 is formed, in accordance with the above noted prior filed applications, is as follows:

(a) open windows for both N and P channel devices in an oxide layer formed on the surface of the semiconductor substrate 12;

(b) form a mask to cover the P channel device area and implant ions to form the N channel device (i.e., the P-well 14 and P$^+$ channel stop 26);

(c) evaporate a metal layer onto both the mask and the N channel device area;

(d) lift off those portions of the metal layer covering the mask;

(e) implant ions to form the P channel device N-well 16 and the N$^+$ channel stop 28 using the remaining portion of the metal layer as a mask;

(f) remove the remaining portion of the metal layer;

(g) form a gate oxide over the exposed surface portions of the P- and N-wells 14, 16;

(h) deposit polysilicon and diffuse N-type (e.g., phosphorous) impurity atoms therein;

(i) define a polysilicon gate for both the N channel 8 and P channel 10 devices and implant P-type (e.g., boron) ions for all sources and drains 18, 20, 22, 24;

(j) define source and drain regions 18, 20 for the N channel device 8 and heavily implant N-type (e.g., arsenic) ions for the N source and drain regions 18, 20 by overcompensating previously implanted boron atoms;

(k) define contact holes to each of the source and drain regions 18, 20, 22, 24 and form metal contacts 40, 42, 44.

Inherent in the structure of the CMOS FET structure 6 of FIG. 1 are two bipolar transistors 50, 52, substantially as shown by the schematic overlay. The vertical bipolar transistor 50 is typically an NPN device having the N-type substrate 12 as a collector, the P-well 14 as a base, and the N-type drain region 18 as an emitter coupled essentially to ground through the metal contact 40. The other bipolar transistor 52 is typically of a lateral PNP configuration having the P-type drain region 24 as an emitter, the N-well and, more generally, the substrate 12 as a base, and the P$^+$ channel stop 26 and P-well 14 as a collector. Thus, the parasitic bipolar transistors 50, 52 are conductively connected via conduction paths 54, 56 essentially creating a current feedback loop. The current gain of the feedback loop is positive and proportional to the product of the current gain, $\beta_p = \beta_{npn} \times \beta_{pnp}$ of each of the parasitic bipolar transistors 50, 52.

Latch-up occurs typically in response to a transient condition, such as a large voltage spike in the otherwise dc voltage potential provided as $V_{DD}$ to the P channel device source contact 42. Consequently, a large amount of current will begin to flow between the source 24 and the source 18 through the network formed by the parasitic bipolar transistors 50, 52 during latch-up. The CMOS FET device 6 ceases to operate as intended and, unless power to the device 6 is quickly removed, irreparable damage may and typically does occur.

The presence of a parasitic bipolar network is not unique to the CMOS FET structure 6 of FIG. 1. It is also not specific to CMOS FET structures formed in silicon substrates. The presence of the parasitic bipolar network is also not specific to twin-well CMOS FET structures. The parasitic bipolar transistor network will occur in any CMOS FET structure formed in a continuous, even lightly conductive epitaxial or bulk substrate material; the structure being further characterized as having a shallow well region such as formed by ion implantation without a subsequent well drive-in diffusion. Generally, so long as there is a well region having a conductivity type opposite that of the semiconductor material in which the structure is provided, both the vertical and the lateral parasitic bipolar transistors will be inherently present. Thus, for the complementary case of a P conductivity substrate, an N-well is essential to provide the P channel FET device, resulting in the inherent formation of a vertical PNP bipolar transistor parasitically coupled with a lateral NPN bipolar transistor.

The only known CMOS FET structure that inherently does not include a parasitic bipolar network, and to which the present invention cannot be applied, occurs when complemetary N and P channel FETs are separately provided in semiconductor islands electrically isolated from one another by insulator material such as silicon dioxide, semi-insulating gallium arsenide, or sapphire.

As a solution to the problem of latch-up, the present invention provides a means of effectively reducing the current gain product $\beta_p$ of the parasitic bipolar transistors to less than one thereby providing a CMOS FET structure that is essentially immune to latch-up. The present invention is applicable to all such CMOS FET structures, as noted above, inherently possessing a parasitic bipolar network.

The benefits of the present invention are obtained by the manner in which the essential well region (conductivity type opposite that of the substrate) is provided and by the manner in which the source and drain regions present therein are provided and subsequently thermally conditioned. Thus, otherwise consistent with the fabrication of the structure as described above and shown in FIG. 1, the P-well region 14 of the preferred embodiment of the present invention is preferably provided by a plurality of ion implantations of P-type impurities, such as boron. The implant dosage and the implantation energy level are selected so as to provide separate and distinct peaks in the carrier concentration $|N_D-N_A|$ profile as measured perpendicular from the substrate surface into the substrate 12, the retrograde peaks being separated by regions of relatively lower carrier concentration. Such a nonuniform carrier concentration profile is hereby defined as a multiple retrograde doping profile. For boron implanted into an exposed silicon surface having a (100) orientation, the multiple implants are preferably performed at energies ranging between approximately 100 and 600 keV so as to each provide a dosage of between approximately $1\times10^{13}$ and $5\times10^{13}$ cm$^{-2}$ to form a multiple retrograde p-well in the N-type silicon substrate. Specific energy implant and dosage values, suitable for providing a corresponding number of retrograde peaks in the doping density profile, can be determined by simple and ordinary calculation and experimentation carried out with regard to the particular implant species and substrate material being used.

Figure 2:
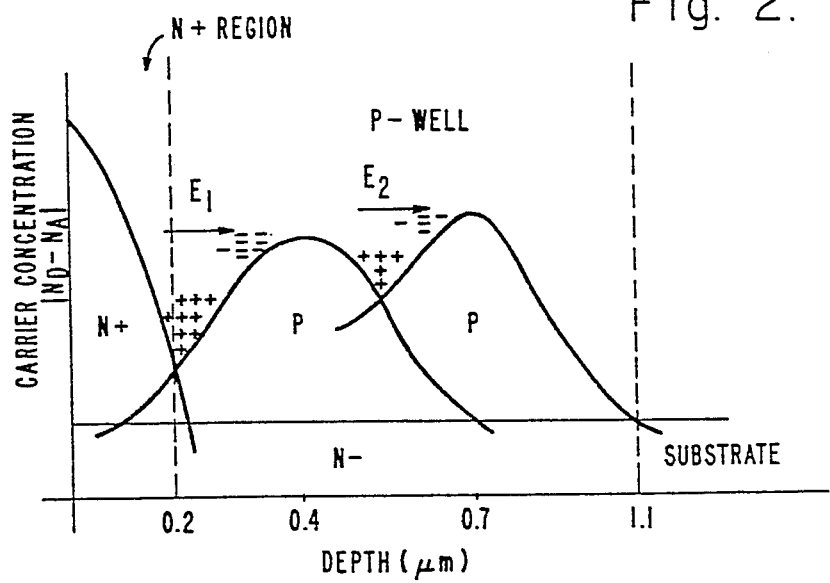
FIG. 2 is a graphical representation of the doping density profile taken through a source or drain region, the well region, and the substrate of the preferred double retrograde well embodiment of the present invention.

In the preferred embodiment of the present invention, two P-well implants are performed so as to provide a double retrograde doping density profile, substantially as shown in FIG. 2. The first implant is performed using boron as the preferred ion species at an energy between approximately 120 and 200 keV at a dosage of approximately $1\times10^{13}$ to $5\times10^{13}$ cm$^{-2}$. The second implant, again preferably using boron as the implant species, is performed at an energy of between approximately 340 to 500 keV also at a dosage of between approximately $1\times10^{13}$ to $5\times10^{13}$ cm$^{-2}$.

Following the formation of the P-well, the surface of the substrate 12 overlying the P-well 14 is prepared in a conventional manner for the formation of the N channel device 8 source and drain regions 18, 20. Note that, preferably, P-type impurities are not implanted into the source and drain region 18, 20 areas of the N channel FET 8 as part of the provision of the source and drain regions 22, 24 of the P channel FET 10. Though an unnecessary process modification, this simplifies the process by obviating the need to overcompensate the P-type impurities in providing the N+ source and drain regions 18, 20. These regions 18, 20 are preferably provided by a high-dose, low energy implant of N-type impurities. For the preferred arsenic impurity, implanted through a gate oxide layer of approximately 400Å, the implant energy is preferably between approximately 30 and 150 keV performed so as to provide a dosage of approximately $5\times10^{15}$ cm$^{-2}$.

The source and drain regions 18, 20 are then subjected to an annealing process step. The temperature and time within which this anneal is performed are selected so that the crystal defects created by the ion implantation of the source and drain regions 18, 20 are only partially removed. This can be accomplished in a variety of manners, including the use of a low temperature furnace anneal at approximately 800° to 875° C. for a total time of approximately 15 to 30 minutes or a transient anneal process utilizing an E-beam, laser, or flashlamp to raise the temperature of the substrate 12 to between approximately 900° and 1000° C. for a total period of between approximately 2 and 20 seconds.

The CMOS FET 6 is preferably completed by exposing the surface portions of the source and drain regions 18, 20, 22, 24, providing the source and drain contacts 40, 42, 44 to finally obtain the structure shown in FIG. 1 consistent with the above noted prior filed patents.

The present invention operates to substantially reduce the current gain of the vertical bipolar transistor 50, reducing the current gain product $\beta_p$ of both of the parasitic bipolar transistors 50, 52 to approximately one or less, and thereby insures immunity to latch-up. The current gain of the vertical bipolar transistor 50 is directly dependent on the injection efficiency of electrons from the source region 18 into and through the well region 14, the vertical bipolar transistor 50 being a minority carrier device and electrons being a minority carrier in an NPN bipolar structure. As described above, the present invention provides for residual defects to be associated with the source region 18 as a result of the incomplete annealing thereof. While the exact distribution of these residual defects is not known, the significant defects in substantial number lie in the deepest portion of the source region 18 (and the drain region 20) and the immediately underlying portion of the P-well 14. In operation, these residual defects act as minority charge carrier recombination centers and thereby effectively reduce the minority carrier injection efficiency into the P-well 14.

It should be noted that the distribution of residual defects inherently does not lie within the channel region underlying the gate 34 of the N-FET device 8 due to the presence of the gate 34 during the source and drain 18, 20 implant. Further, though the greatest density of defects may initially lie at the surface of the source and drain regions 18, 20, the incomplete annealing will correspondingly have its greatest effect in removing these surface crystal defects. Thus, there is no significant number of, residual surface defects. Also, as a majority carrier device, the N channel FET transistor 8 is relatively less sensitive to the presence of residual defects than bipolar transistors. Consequently, the electrical operation of the N channel FET device 8 is substantially if not completely unaffected by the residual defects introduced in accordance with the present invention.

The multiple retrograde doping profile of the P-well region serves to reduce the transport efficiency of minority carriers therethrough in a number of ways. The minority carrier transport efficiency is directly reduced by an electric field associated with each of the retrograde peaks of the doping profile. As graphically shown in FIG. 2 with regard to the preferred double retrograde doping profile, an electric field $E_1$ is associated with the shallowest retrograde peak. The polarity of $E_1$ is positive into the substrate 12 in the case of a NPN parasitic bipolar transistor 50. The electric field $E_1$ is the inherent result of a local space charge difference arising as a result of the locally nonuniform (retrograde) doping profile. Accordingly, a second electric field $E_2$ is associated with the second retrograde peak of the doping profile. Naturally, additional electric fields will be respectively associated with the further retrograde peaks in a multiple retrograde doping profile P-well.

Due to the presence of the multiple electric fields, the transport of the minority carriers through the essential well region will be successively retarded as each field is encountered. Consequently, the likelihood that the minority charge carriers (electrons in the case of a vertical NPN parasitic transistor) will recombine is increased in proportion to the increase in the number and intensity of electric fields. Further, the opportunity for the minority charge carrier electrons to recombine is increased by the relatively greater average doping density, as well as increasing well depth, afforded by increasing the number of retrograde peaks in the doping density profile of the P-well 14. As should be apparent, these effects are cumulative such that the net effect is a substantially reduced minority charge carrier transport efficiency through the P-well 14.

EXAMPLE

A CMOS FET device of the structure shown in FIG. 1 and having the double retrograde doping density profile shown in FIG. 2 has been fabricated in accordance with the present invention. The P-well was provided by two successive ion implantations, the first at approximately 120 keV and the second at approximately 340 keV, each to a dosage of approximately $1 \times 10^{13}$ cm$^{-2}$. Following the formation of a 400Å thick silicon oxide gate oxide layer and doped polysilicon gate, arsenic was then implanted at 80 keV and 150 keV to a total dosage of $5 \times 10^{15}$ cm$^{-2}$ to form the source and drain regions of the N channel FET device. A transient anneal was then performed by rapidly rastor scanning the device substrate, thereby heating the substrate to approximately 1000° C. for a period of approximately 10 seconds. All other processing of the device to obtain the completed structure as shown in FIG. 1 was performed in accordance with that described above.

The device produced has a P-well depth of approximately 1.1 μm, source and drain region depths of approximately 0.2 μm, and retrograde peaks at approximately 0.4 and 0.7 μm below the surface of the substrate. The spacing between the P+ source region 22 was, at its closest approach, approximately 2 μm apart from the P-well 14. The electric fields associated with each of retrograde peaks has been estimated as $E_1 = 700$ volts per centimeter and $E_2 = 350$ volts per centimeter.

In testing the device, the current gain of the PNP lateral bipolar parasitic transistor was determined to be approximately 0.1 to 0.2. The current gain of the vertical NPN parasitic bipolar transistor was determined to be approximately 2.5. Consequently, the current gain product of the device is between 0.25 and 0.5 approximately and, 04 therefore is by definition inherently immune latch-up.

Thus, a high density CMOS FET structure that is essentially immune to latch-up has been described. Further, a method of providing the structure and that is applicable to a wide variety of high density CMOS FET fabrication processes, characterized as a class wherein the essential well region source and drain regions are ion implanted, has also been described.

Naturally, many modifications and variations of the present invention are possible in light of the above teachings. In particular, such modifications as utilizing a different substrate material or substrate structure, such as gallium arsenide or silicon on sapphire, respectively, are contemplated. Variations in the manner of fabricating structures consistent with the present invention, such as the use of ion channeling and focused ion beam implant techniques in implanting the essential well region and source and drain regions, are also comtemplated. Embodiments of the present invention wherein the substrate possesses a P-type conductivity and the essential well region possesses an N-type conductivity are also contemplated. It is therefor to be understood that, within the scope of the appended claims, the present invention may be practiced otherwise than as specifically described.

What is claimed is:

1. A method of providing latch-up immunity in the fabrication of a CMOS FET at a surface of a substrate comprising the steps of:
    (a) performing at least two well impurity ion implants into the surface of said substrate, each of said implants being performed at a different implant energy so as to provide a well region within said substrate having at least two separate and distinct peaks in the carrier concentration profile extending perpendicularly from the substrate surface into said substrate for the entire depth of the well below portions where source and drain regions are to be formed with sufficient doping density to substantially inhibit latch-up of the FET;
    (b) performing an ion implantation of source and drain impurities into the surface of said substrate so as to provide source and drain regions in said well region; and
    (c) performing an incomplete anneal of said well, source and drain regions such that a substantial density of residual crystal defects remain in and generally associated with the deepest portions of said source and drain regions and the respective immediately underlying portions of said well, source and drain regions, said residual defects acting as charge carrier recombination centers.

2. The method of claim 1 wherein said incomplete anneal comprises the step of heating said substrate to within a temperature range of between approximately 900° C. and 1000° C. for a period of time between approximately 2 and 20 seconds.

3. The method of claim 1 wherein said incomplete anneal comprises the step of heating said substrate to within a temperature range of between approximately 800° and 875° C. for a period of time between approximately 15 and 30 minutes.

4. The method of claim 2 wherein said heating step is performed at a temperature of approximately 1000° C. for a period of time of approximately 10 seconds.

5. The method of claim 1 wherein said plurality of well impurity ion implants comprises at least two implants, a shallow implant being performed within an implant energy range of approximately 100 to 200 KeV and a relatively deeper implant being performed within an implant energy range of approximately 340 to 500 KeV.

6. The method of claim 5 wherein:
    (a) said substrate is silicon; and
    (b) said plurality of well impurity implants is comprised of two implants, a first implant being performed at approximately 120 KeV and a second implant being performed at approximately 340 keV, each providing a dosage of approximately $1 \times 10^{13}$ cm$^{-2}$ of phosphorous ions.

* * * * *